(12) United States Patent
Joyce et al.

(10) Patent No.: US 6,253,623 B1
(45) Date of Patent: *Jul. 3, 2001

(54) METHOD FOR NONDESTRUCTIVELY MEASURING THE STRESS OF FABRICATED SEMICONDUCTOR CHIPS

(75) Inventors: William Baxter Joyce, Basking Ridge; Ronald Edward Scotti, White House Station, both of NJ (US)

(73) Assignee: Lucent Technologies Inc., Murray Hill, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/200,137

(22) Filed: Nov. 25, 1998

(51) Int. Cl.[7] ........................................... G01N 3/20
(52) U.S. Cl. ................................................. 73/850
(58) Field of Search .................... 73/800, 801, 827, 73/842, 850, 104, 105

(56) References Cited

U.S. PATENT DOCUMENTS

| | | | |
|---|---|---|---|
| 3,965,726 | * | 6/1976 | Vahaviolos .............................. 73/658 |
| 4,591,996 | * | 5/1986 | Vachon .................................... 702/42 |
| 4,767,911 | * | 8/1988 | Maram et al. .................. 219/130.01 |
| 4,789,236 | * | 12/1988 | Hodor et al. ............................ 356/33 |
| 5,432,595 | * | 7/1995 | Pechersky ........................... 356/35.5 |

* cited by examiner

*Primary Examiner*—Max Noori

(57) ABSTRACT

A method for nondestructively and accurately determining the stress of a fabricated semiconductor chip soldered, brazed or otherwise bonded to a submount using optical microscopy and finite element analysis. Deformations on a top surface of the semiconductor chip are first examined using optical microscopy. The deformations are then correlated using finite element analysis to the stress on the semiconductor chip caused by the soldering process. If the stress is determined to be within an acceptable range of measurement, then the semiconductor chip will have been properly soldered to the submount and can be used.

19 Claims, 1 Drawing Sheet

METHOD FOR NONDESTRUCTIVELY MEASURING THE STRESS OF FABRICATED SEMICONDUCTOR CHIPS

FIELD OF THE INVENTION

This invention relates to testing and evaluating semiconductors, and more particularly to a method for nondestructively and accurately determining the stress of a semiconductor chip or other small component that is bonded together by solder or other means.

BACKGROUND OF THE INVENTION

Laser transmitters and other small modern electronic components are widely used today in various applications, such as communications systems. Such components are, for example, typically comprised of at least one semiconductor chip which is soldered to a submount assembly. The solder used to fabricate such components is applied at sufficiently high temperatures that the resulting stress can adversely affect the functionality of the semiconductor chip.

This stress typically results from one of several sources. Either from a mismatch in the temperature coefficients of the semiconductor chip and the submount, or from the solder having a substantially higher melting temperature higher than that at which the chip is used. Alternatively, the stress can result from an improperly formed solder bond between the chip and the submount.

Conventional methods for determining whether an semiconductor chip has been properly soldered to a submount typically involve a crude "push-off" test in which the chip is sheared from the submount. This test, however, suffers from a significant drawback. Specifically, it is always destructive to the chip rendering it inoperable. In addition, this test is often difficult to perform because the chip may shatter rather than detach from the submount. Moreover, the test is often provides inconclusive results when the solder pattern of the detached chip is examined.

SUMMARY

A method for nondestructively and accurately determining the stress of a fabricated semiconductor chip soldered to a submount by using a surface profiling high resolution microscope to examine the top surface of the semiconductor chip, and then using finite element analysis (FEA) to correlate deformations observed on the top surface to the stress caused to the semiconductor chip during the soldering process, wherein if the stress is within an acceptable range of measurement the chip has been properly soldered to the submount and can be used.

DETAILED DESCRIPTION OF THE INVENTION

Figure 1:
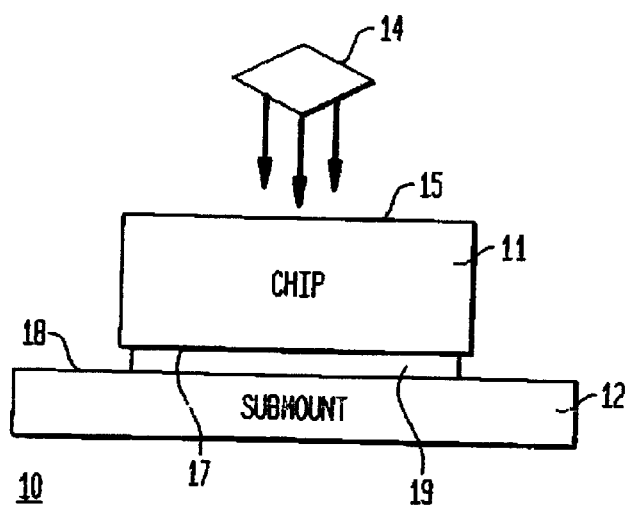
FIG. 1 shows a first semiconductor chip which can be examined using the method of the present invention, wherein the degree of the deformations on the top surface of the chip indicate that it is stressed within an acceptable range such that it can be used.

The following detailed description relates to a preferred embodiment of a method for determining the stress of a semiconductor chip according to the present invention. Referring to FIG. 1 there is shown a semiconductor chip assembly 10 which can be examined using the present invention. Chip assembly 10 is comprised of semiconductor chip 11 which is soldered to submount 12.

Figure 2:
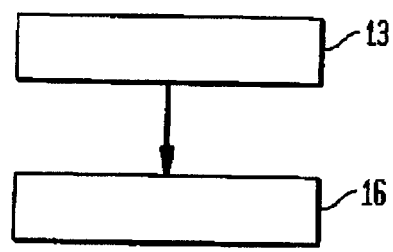
FIG. 2 shows a flowchart of an exemplary embodiment of the method of the present invention for testing the stress of semiconductor chips.

As shown in flowchart form in FIG. 2 the method of the present invention operates as follows. At step 13, surface profiling high resolution microscope 14, such as a scanning interferometric microscope, an atomic force probe microscope or a Fourier microscope, is used to examine top surface 15 of semiconductor chip 11. At step 16, FEA is used to correlate the height of deformations observed on top surface 15 to the stress on semiconductor chip 11 resulting from soldering, brazing or otherwise bonding bottom surface 17 of semiconductor chip 11, or other component, to top surface 18 of submount 12.

This stress will be within an acceptable range of measurement if the temperature coefficients of semiconductor chip 11 and submount 12 are closely matched, if the solder has a melting temperature not greatly higher than the temperature at which chip 11 is used, and if solder contact 19 is properly formed between chip 11 and submount 12, such that semiconductor chip 11 can be used. By contrast, the stress will be beyond an acceptable range of measurement if any of the three foregoing criteria are not satisfied such that semiconductor chip 11 can not be used.

Figure 3:
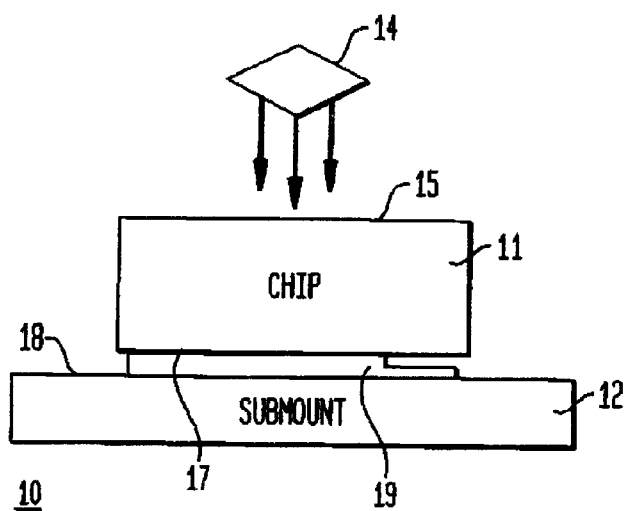
FIG. 3 shows a second semiconductor chip which can be examined using the method of the present invention, wherein the degree of the deformations on the top surface of the chip indicate that it is stressed beyond an acceptable range such that it can not be used.

As shown in FIG. 1, the deformations on top surface 15 may indicate that semiconductor chip 11 is under an acceptable amount of stress and can be used. By contrast, in FIG. 3 the deformations on top surface 15 indicate that semiconductor chip 11 is under an unacceptable amount of stress which precludes it from being used.

Once a plurality of deformations on the top surface of a particular type of semiconductor chip have been correlated to corresponding stress values, then all subsequently fabricated chips of that type need only be inspected visually using a microscope to determine whether the chips are unduly stressed such that they can not be used. Alternatively, this invention can be employed to selectively examine only a certain percentage of the chips fabricated in a particular batch. The present invention can also be employed to determine the stress of soldered, brazed or otherwise bonded structures other than semiconductor chips. For example, this invention can be used to determine the stress of a submount which is soldered, brazed or otherwise bonded to a module.

Numerous modifications to and alternative embodiments of the present invention will be apparent to those skilled in the art in view of the foregoing description. Accordingly, this description is to be construed as illustrative only and is for the purpose of teaching those skilled in the art the best mode of carry out the invention. Details of the structure may be varied substantially without departing from the spirit of the invention and the exclusive use of all modifications which come within the scope of the appended claims is reserved.

What is claimed is:

1. A method for nondestructively and accurately determining the stress of a semiconductor chip, comprising the steps of:
   examining a first surface of a semiconductor chip soldered to a submount; and
   correlating deformations observed on the first surface of the semiconductor chip to the stress of the semiconductor chip, wherein the deformations are caused by a void in a solder contact formed on a second surface of the semiconductor chip.

2. The method according to claim 1, wherein a surface profiling high resolution microscope is used to examine the first surface of the semiconductor chip.

3. The method according to claim 1, wherein finite element analysis is used to correlate deformations observed on the first surface of the semiconductor chip to the stress of the semiconductor chip.

4. The method according to claim 1, wherein the first surface of the semiconductor chip is a top surface of the semiconductor chip.

5. The method according to claim 1, wherein if a solder contact was properly formed between a bottom surface of the semiconductor chip and the submount, then the stress of the semiconductor chip will be within an acceptable range of measurement such that it can be used.

6. The method according to claim 5, wherein the second surface of the semiconductor chip is a bottom surface of the semiconductor chip.

7. The method according to claim 1, wherein if a solder contact was improperly formed between a bottom surface of the semiconductor chip and the submount, then the stress of the semiconductor chip will be beyond an acceptable range of measurement such that it can not be used.

8. The method according to claim 7, wherein the second surface of the semiconductor chip is the bottom surface of the semiconductor chip.

9. A method for nondestructively and accurately determining the stress of a semiconductor chip, comprising the steps of:

examining a top surface of a semiconductor chip soldered to a submount; and correlating deformations observed on the top surface of the semiconductor chip to a void formed in a solder contact formed between a bottom surface of the semiconductor chip and submount, wherein if the bottom surface of the semiconductor chip was properly soldered to the submount, the stress of the semiconductor chip will be within an acceptable range of measurement indicating that the semiconductor chip can be used.

10. The method according to claim 9, wherein a high resolution microscope is used to examine the top surface of the semiconductor chip.

11. The method according to claim 9, wherein finite element analysis is used to correlate deformations observed on the top surface of the semiconductor chip with the stress of the semiconductor chip.

12. The method according to claim 9, wherein if the semiconductor chip is improperly soldered to the submount, the stress will be beyond an acceptable range of measurement indicating that the semiconductor chip can not be used.

13. A method for nondestructively and accurately determining the stress of a first structure bonded to a second structure, comprising the steps of:

examining a first surface of a first structure; and correlating deformations observed on the first surface of the first structure to a void formed in a bond contact formed between a second surface of the first structure and a second structure in order to determine the stress of the first structure.

14. The method according to claim 13, wherein a Fourier microscope is used to examine the first surface of the first structure.

15. The method according to claim 13, wherein finite element analysis is used to correlate deformations observed on the first surface of the first structure with the stress of the first structure.

16. The method according to claim 13, wherein if the bond contact was properly formed between the bottom surface of the first structure and the second structure, then the stress of the first structure will be within an acceptable range of measurement such that it can be used.

17. The method according to claim 13, wherein if the bond contact was improperly formed between the bottom surface of the first structure and the second structure, then the stress of the first structure will be beyond an acceptable range of measurement such that it can not be used.

18. The method according to claim 13, wherein the first structure is a semiconductor chip.

19. The method according to claim 13, wherein the first structure is a submount and the second structure is a module.

* * * * *